United States Patent [19]

Seki et al.

[11] Patent Number: 5,169,477
[45] Date of Patent: Dec. 8, 1992

[54] ETCHING APPARATUS FOR FORMING MICROCIRCUIT PATTERNS ON A PRINTED CIRCUIT BOARD

[75] Inventors: Kameharu Seki; Shin Kawakami; Isamu Kubo, all of Fujikubo, Japan

[73] Assignee: Nippon CMK Corp., Japan

[21] Appl. No.: 734,260

[22] Filed: Jul. 22, 1991

[51] Int. Cl.$^5$ .................................... H01L 21/00
[52] U.S. Cl. ................................ 156/345; 156/640
[58] Field of Search ........................... 156/345, 640

[56] References Cited

U.S. PATENT DOCUMENTS

| | | | |
|---|---|---|---|
| 4,565,755 | 1/1986 | Ohtake et al. | 156/640 |
| 4,609,575 | 9/1986 | Burkman | 156/640 |
| 4,861,422 | 8/1989 | Kudou et al. | 156/640 |
| 4,973,379 | 11/1990 | Brock et al. | 156/640 |
| 4,985,111 | 1/1991 | Ketelhohm | 156/640 |

OTHER PUBLICATIONS

"Aerosol Jet Etching of Fine Patterns", by Chan et al.; Appl. Phys. Lett. 51(26); 1987; pp. 2203-2205.

*Primary Examiner*—Brian E. Hearn
*Assistant Examiner*—George Goudreau
*Attorney, Agent, or Firm*—Bruce L. Adams; Van C. Wilks

[57] ABSTRACT

An etching apparatus for forming circuit patterns on a printed circuit board comprises a conveyor for conveying printed circuit boards, a solvent pump for pumping etching solution, nozzles for spraying etching liquid or water on the printed circuit board, and a rinsing device for rinsing the surface of the printed circuit board. The discharge pressure of the pump for the etching solvent is preferably in the range 5~10 kg/cm$^2$ and the distance between the nozzles and the printed circuit board is 50~200 mm.

7 Claims, 2 Drawing Sheets

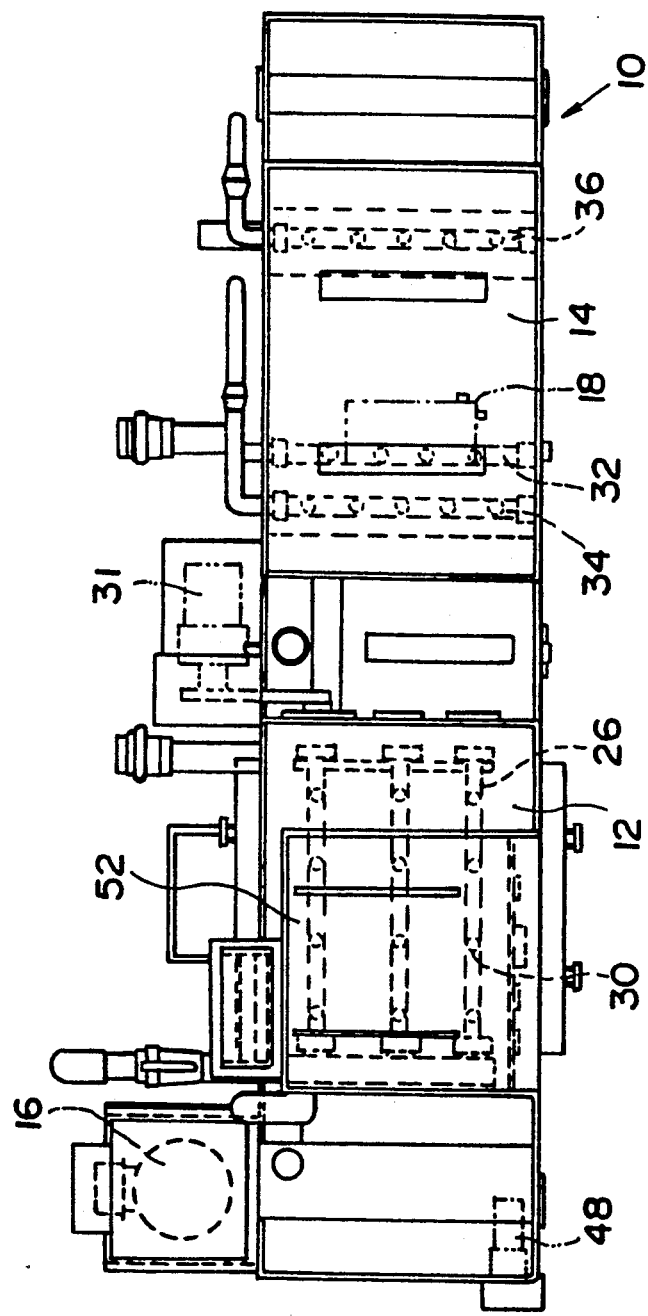

ETCHING APPARATUS FOR FORMING MICROCIRCUIT PATTERNS ON A PRINTED CIRCUIT BOARD

BACKGROUND OF THE INVENTION

The present invention relates to an etching apparatus for forming circuit patterns, particularly, microcircuit patterns on a printed circuit board.

A conventional etching apparatus for forming microcircuit patterns on a printed circuit board is carried out by utilizing an etching solvent of water solution including cupric chloride, ferric chloride, persulfate, and hydrogen peroxide, sulfuric acid and alkali solvent or the like, the discharge pressure of the etching solvent from the nozzle is made very low, and with the spraying pressure of the etching solvent is $1 \sim 3$ kg/cm$^2$.

In the above conventional etching apparatus, the printed circuits are formed with large flow amount of etching liquid, such as low discharge pressure of $1 \sim 3$ kg/cm$^2$ and discharge flow rate of $8 \sim 10$ lt/min. In this case, the balance of etching becomes uneven on the printed circuit board, resulting in a residue of etching on the upper surface thereof, and an over-etching on the lower surface of the printed circuit board, thereby causing the printed circuits to become loosened from the printed circuit board. Therefore, at present, it is difficult to carry out the stable and uniform etching when forming printed circuits having a width of 0.1 mm or less.

SUMMARY OF THE INVENTION

It is an object of the present invention to overcome the above described disadvantages of the conventional etching apparatus for etching microcircuit patterns on a printed circuit board.

It is another object of the present invention to provide en etching apparatus suitable for forming microcircuit patterns on a printed circuit board.

According to the present invention, there is provided an etching apparatus for forming circuit patterns on a printed circuit board comprising a conveyer for conveying printed circuit boards, a solvent pump for pumping etching solution, nozzles for spraying etching liquid or water on the printed circuit board, and a rinsing device for rinsing the surface of the printed circuit board, the discharge pressure of the pump for etching solvent being $5 \sim 10$ kg/cm$^2$ and the distance between the nozzle and the printed circuit board being $50 \sim 150$ mm.

The etchant solvent is a water solution including cuprid chloride, ferric chloride, persulfate, and hydrogen peroxide, sulfuric acid, and alkali etchant or the like.

The discharge particle diameter of the etching solvent is $100 \sim 200$ μm.

According to the present invention, the discharge pressure is made high, the discharge flow amount is decreased and the distance to the workpiece becomes the required particle diameter, so that the fine pattern having a width of, for example, less than 100 μm can be formed in half of the conventionally required time. Thus, the patterns on both sides of the printed circuit board can be etched away evenly, thereby improving producibility and yield.

BRIEF DESCRIPTION OF THE DRAWINGS

FIG. 2 is a plan view showing the etching apparatus for forming circuit patterns on a printed circuit board according to the present invention.

DETAILED EXPLANATION OF THE PREFERRED EMBODIMENT

Figure 1:
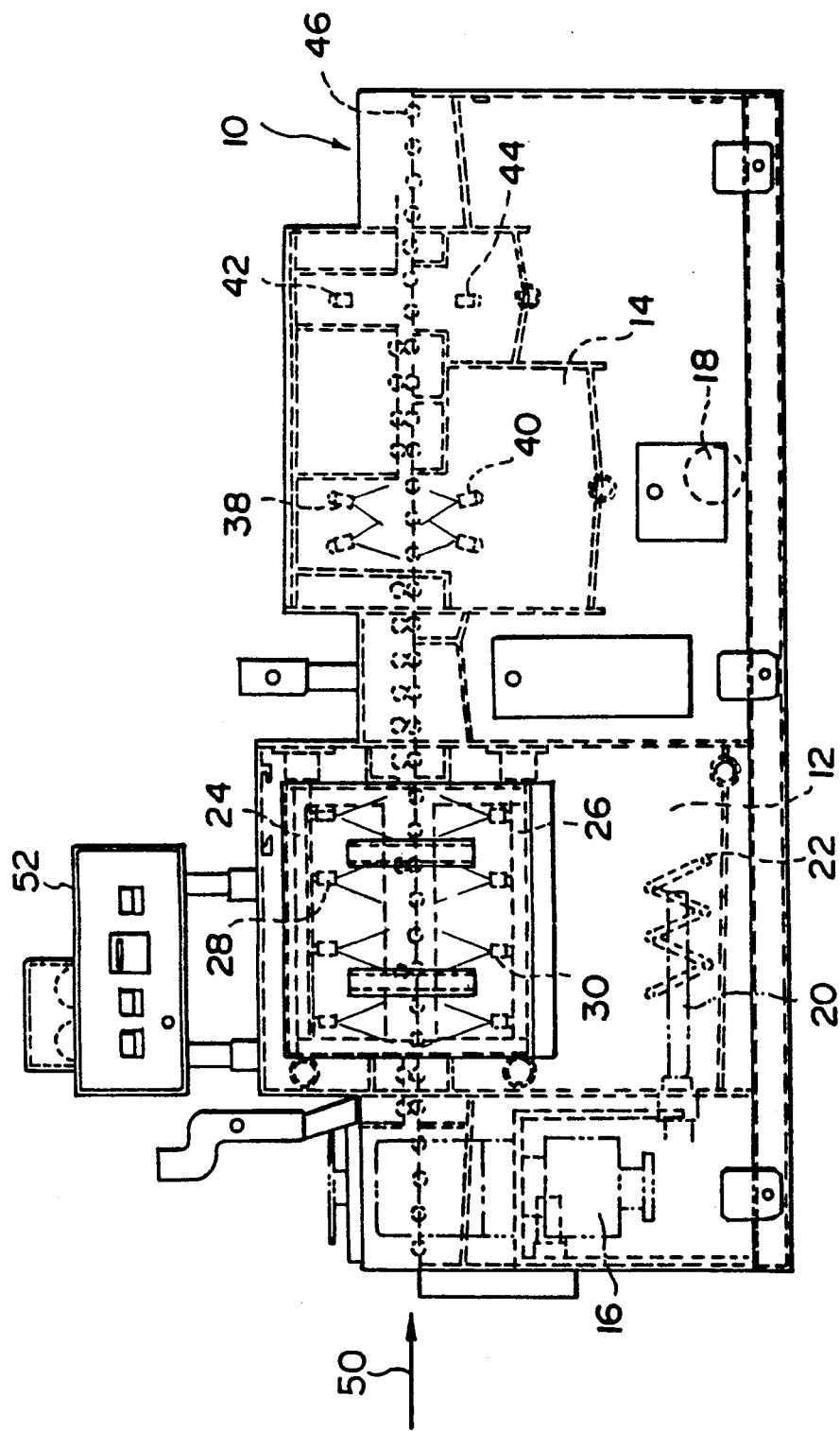
FIG. 1 is a side view showing an embodiment of an etching apparatus for forming circuit patterns on a printed circuit board according to the present invention.

Now to the drawings, there is shown an embodiment of an etching apparatus for forming circuit patterns on a printed circuit board according to the present invention. Like parts are shown by corresponding reference characters throughout the several views of the drawings.

FIGS. 1 and 2 are, respectively, a side view and a plan view showing an embodiment of an etching apparatus according to the present invention. The etching apparatus comprises a solvent tank 12 and a water tank 14 which are defined in a body 10 of a metal sheet. These tanks 12 and 14 are communicated to an etching pump 16 and a rinsing pump 18, respectively. The solvent tank 12 accommodates a heater element 20 and a cooling pipe 22 therein, so as to hold the temperature of the liquid to a constant value. An etching solvent of comparatively high pressure, $5 \sim 10$ kg/cm$^2$ is supplied to an upper nozzle 28 and a lower nozzle 30 through manifolds 24 and 26, respectively, from the etching pump 16. Manifolds 28 and 30 are swung by a predetermined angle by an oscillating motor 31 (FIG. 2) to spray the solvent or the water on a surface of the printed circuit board.

At the same time, an amount of water flow is supplied to a first and a second nozzle 38, 40, 42 or 44 from the rinsing tank 18 through manifolds 32, 34 and 36, respectively.

A roller conveyer 46 is driven by a conveyer motor 48 (FIG. 2) through a transmission device (not shown) to convey a copper clad laminate for forming the printed circuit board horizontally in the direction of an arrow 50 in the body 10.

An operation of the etching apparatus according to the present invention is explained.

A copper foil is provided on a base plate for the printed circuit board and then an etching photoresist layer is provided on the copper foil. Then, a given mask is covered on the photoresist layer and the mask is exposed by the ultraviolet rays to print the pattern of the etching photoresist and then unexposed portions of the etching photoresist are rinsed and etched away and thus the pattern on the copper foil is coated by the photoresist, thereby exposing another portion thereof. In this way, the thus formed printed circuit board is subjected to an etching process by the use of the etching apparatus according to the present invention to etch away the space between the required circuits.

These printed circuit boards are continuously supplied to a conveyer 46 from its inlet in the direction of an arrow 50. The etching liquid is heated or cooled to a given temperature by the heater 20 and the cooling pipe 22 provided in the solvent thank 12, and is sprayed from the monifolds 28 and 30 through the etching pump 16, as well as manifolds 24 and 26. In this case, the spraying direction of the nozzle 28 and 30 is changed by swaying the manifolds 24 and 26 with the oscillating motor 31. If the printed circuit board has one side circuit, the upper nozzle 24 is stopped to operate, and if the printed circuit board has both sides circuits, both nozzle 24 and 26 are operated. The control of these nozzle operations is performed by a control board or console 52.

According to the present invention, the etching liquids to be used are of water solution including cupric chloride, ferric chloride, persulfate, and hydrogen peroxide, sulfuric acid, and alkali etchant of the like. The discharge pressure of the etching pump 16 is 5~10 kg/cm$^2$, the particle diameter of the discharge fluid is 100~200 μm and the distance between the printed circuit board and the nozzles 28 and 30 is 50~150 mm.

According to the present invention, therefore, the very high discharge pressure comparative with the conventional etching method is utilized to make the discharge particle diameter very small, so that the etching liquid is reached to the space between the circuits of fine or microcircuit, thereby obtaining uniform etching in a short time. The flow rate of the etching liquid is very small and the amount of the etching liquid flowing on the surface of the printed circuit board is also less. The spraying of high pressure liquid from the nozzle completely reaches at the portion to be etched irrespective of the amount of liquid on the surface of the printed circuit board.

After etching is finished, the printed circuit boards are conveyed to the rinsing station by a conveyer 46 and rinsed by the water flow from the rinsing pump 18 through the first and second rinsing nozzle 38, 40; 42, 44. The printed circuit board conveyed from the outlet of the conveyer is dried in a drying device (not shown).

What is claimed is:

1. An etching apparatus for forming circuit patterns on a printed circuit board, comprising: a conveyer for conveying printed circuit boards, a solvent pump for pumping etching solvent, nozzles for spraying etching liquid or water on the printed circuit board, and a rinsing device for rinsing the surface of the printed circuit board, wherein the discharge pressure of the pump for the etching solvent is 5~10 kg/cm$_2$ and the distance between the nozzles for spraying etching liquid or water on the printed circuit board and the printed circuit board is 50~150 mm.

2. An etching apparatus for forming circuit patterns on a printed circuit board according to claim 1; wherein the etching solvent is a water solution including cupric chloride, ferric chloride, persulfate, and hydrogen peroxide, sulfuric acid, and alkali etchant or the like.

3. An etching apparatus for forming circuit patterns on a printed circuit board according to claim 1; wherein the discharge particle diameter of the etching solvent is 100~200 μm.

4. An etching apparatus for forming circuit patterns on a printed circuit board, comprising: conveying means for conveying a printed circuit board; pumping means for pumping etching solution at a discharge pressure of 5~10 kg/cm$^2$; and spraying means including nozzles receptive of the pumped etching solution for spraying the etching solution on the printed circuit board while the printed circuit board is being conveyed, the nozzles being disposed a distance of 50-150 mm. from the printed circuit board during the spraying of the printed circuit board.

5. An etching apparatus according to claim 4; further comprising rinsing means for rinsing the surface of the printed circuit board.

6. An etching apparatus according to claim 4; wherein the etching solution is a water solution comprising at least one of cupric chloride, ferric chloride, persulfate, hydrogen peroxide, sulfuric acid, and alkali etchant.

7. An etching apparatus according to claim 4; wherein the etching solution has a discharge particle diameter in the range of 100~200 μm.

* * * * *